United States Patent
Wu et al.

(10) Patent No.: US 6,687,527 B1
(45) Date of Patent: Feb. 3, 2004

(54) SYSTEM AND METHOD OF USER GUIDANCE IN MAGNETIC RESONANCE IMAGING INCLUDING OPERATING CURVE FEEDBACK AND MULTI-DIMENSIONAL PARAMETER OPTIMIZATION

(75) Inventors: Dee H. Wu, Shaker Heights, OH (US); Troy K. Havens, South Euclid, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 54 days.

(21) Appl. No.: 09/941,293

(22) Filed: Aug. 28, 2001

(51) Int. Cl.$^7$ ............................................. A61B 5/055
(52) U.S. Cl. ......................................... 600/410; 324/318
(58) Field of Search ................................ 382/128, 131; 324/307, 309, 312, 318; 600/408, 410, 416, 413

(56) References Cited

U.S. PATENT DOCUMENTS 5,758,646 A * 6/1998 Van Der Meulen et al. 600/407
6,260,005 B1 * 7/2001 Yang et al. ................... 703/11

FOREIGN PATENT DOCUMENTS

| EP | 0 567 794 A | 11/1993 |
| EP | 1 004 891 A | 5/2000 |
| JP | 2001 017407 A | 1/2001 |
| WO | WO 91/00530 A | 1/1991 |

* cited by examiner

*Primary Examiner*—Ruth S. Smith
(74) *Attorney, Agent, or Firm*—Fay, Sharpe, Fagan, Minnich & McKee, LLP

(57) ABSTRACT

A magnetic resonance imaging (MRI) apparatus (10) operator guidance system (60) calculates monitor parameters and limit values for selectable parameters. The monitor values are displayed (200) along with a sub-set of the selectable parameters (100) and the limit values therefor. A curve is plotted (420, 700), comprising one of a desirability factor, a monitor parameter, and a selectable parameter as a function of a domain comprising at least one selectable parameter. Optionally, the desirability factor (700) is optimized (530) by adjusting at least one selectable parameter in accordance with a pre-defined mathematical optimization algorithm whereby the at least one selectable parameter is optimized. In another aspect, a data repository (68) stores independent parameter value sets and associated images. Selected contents of the data repository are displayed (502), and a stored imaging session is selected (504) based on the displayed contents. Initial values for the selectable parameters corresponding to the stored selected imaging session are retrieved (506) from the data repository (68).

19 Claims, 10 Drawing Sheets

SYSTEM AND METHOD OF USER GUIDANCE IN MAGNETIC RESONANCE IMAGING INCLUDING OPERATING CURVE FEEDBACK AND MULTI-DIMENSIONAL PARAMETER OPTIMIZATION

BACKGROUND OF THE INVENTION

The present invention relates to the magnetic resonance arts, and more particularly to user interfaces for clinical imaging systems. The invention is particularly suitable for user interfacing with a magnetic resonance imaging (MRI) apparatus in a clinical setting, and will be described with particular reference thereto. However, it will be appreciated that the invention will also find application in conjunction with other MRI applications, other medical imaging methods and apparatus, in medical technologist training, and the like.

A magnetic resonance imaging (MRI) apparatus excites magnetic nuclear resonances in a subject, e.g. a patient, and manipulate and detect the resultant magnetic resonance signal. By limiting the spatial volume of the magnetic excitations and by spatially- and/or phase-encoding the magnetic resonance signal, usually through the use of applied magnetic field gradients, image representations of body parts, blood flow, injected radiopharmeceutical distributions, and the like are reconstructed from the magnetic resonance measurements.

MRI apparatus are operated in a multitude of imaging modes, for example SE, FE/CBASS, FSE, EPI (DWI/PWI), GRASE, and other modes. The choice of operating mode is based upon the body part to be imaged and the clinical aspects under study. By appropriately selecting MRI operational parameters the conditions can be selectively weighted to produce images that are proton density ($\rho$) weighted, $T_1$, weighted, $T_2$ weighted, et cetera. Scan parameters can also be optimized for imaging a particular body part and for using particular RF coils or coil arrays.

These various imaging capabilities are effectuated through appropriate selection of a large number of quantitative input parameters, such as the scan repeat time, the scan resolution, the interecho spacing, the bandwidth, the time-to-echo, and so forth. In all, twenty to forty input parameters are typically available for operator manipulation. These parameters are not, however, fully independent insofar as the setting of one parameter, e.g. the bandwidth, typically changes or limits the dynamic range of other parameters, e.g. the scan time.

The vast quantitative input parameter space often introduces practical limitations on the obtained image quality. Clinical MRI systems are usually operated by technologists who often have limited knowledge of the physical interrelations between the various parameters. Clinical MRI systems are also usually operated under significant time constraints in which patient throughput is an important consideration. Imaging under these conditions is often performed using sub-optimal parameter values, and these sub-optimized imaging conditions lead to degraded image quality that can limit the clinical value of the results. Thus, a critical area of clinical MRI development is the user interface design.

Prior art user interfaces (UI) typically provide the operator with a large number of input parameters, e.g. typically twenty to forty input parameters. Operator guidance in user selection of these parameters is usually limited to providing pre-designed parameter value sets for specific imaging tasks. Thus, for example, a technologist who wants to acquire a $T_2$ weighted brain scan using an EPI imaging mode retrieves a pre-designed parameter value set corresponding to that type of image. The retrieved parameters are displayed by the UI. The operator typically either executes the scan using the pre-designed parameter values in unmodified form, or makes parameter adjustments through the UI based upon the operator's prior experience and knowledge prior to acquiring the image.

In the latter case, the prior art UI systems usually provide only limited operator assistance in making the adjustments. Typically, feedback includes only a signal-to-noise ratio (SNR) value and a pixel or voxel size. A specific absorption ratio (SAR) value is usually calculated as a safety check, but the SAR user feedback is often limited to an overrange alarm indicator which indicates that the patient would be subject to unacceptably high energy fields during image scanning using the presently selected parameter values.

Importantly, the prior art UI systems typically provide no user guidance with respect to parameter interrelations and tradeoffs, beyond generally unhelpful parameter-out-of-range errors. In view of the demanding time constraints often imposed on clinical MRI, the technologist often finds these complex prior art UI systems overly complicated and contributory to operator errors and to sub-optimal acquired images. Only a limited amount of information about the interrelations which connect the MRI operational parameters is provided.

The present invention contemplates an improved system and method which overcomes the aforementioned limitations and others.

SUMMARY OF THE INVENTION

According to one aspect of the invention, a method for providing guidance to a magnetic resonance imaging (MRI) apparatus operator is disclosed. A desirability factor function is calculated, which depends upon a plurality of MRI operating parameters. Optimized values are obtained for the plurality of MRI operating parameters through analysis of the desirability factor function.

Preferably, the calculating of a desirability factor function includes calculating a monitor function, calculating a penalty function corresponding to a first parameter selected from the plurality of MRI operating parameters, and calculating the desirability factor function by mathematically combining the monitor function and the penalty function.

Preferably, the calculating of a monitor function includes calculating an estimated signal-to-noise ratio value. The mathematical combining preferably includes additively or subtractively combining the estimated signal-to-noise ratio with the penalty function.

The calculating of the penalty function preferably includes calculating a barrier function that has a prohibitively undesirable value within a pre-selected range of the first parameter.

The calculating of the penalty function preferably includes calculating a function whose value becomes less desirable as the value of the first parameter increasingly deviates from a default range.

The obtaining of optimized values for the plurality of MRI operating parameters through analysis of the desirability factor function preferably includes optimizing the desirability factor function with respect to at least one of the plurality of MRI operating parameters using an iterative optimization algorithm.

The obtaining of optimized values for the plurality of MRI operating parameters through analysis of the desirability factor function preferably includes graphically displaying a plot of the desirability factor function plotted against at least one of the plurality of MRI operating parameters on a display area of an associated interactive display device. A selection of the optimized values is received from the MRI apparatus operator via the associated interactive display device.

The method preferably further comprises: receiving initial values for the plurality of MRI operating parameters; calculating limit values corresponding to the MRI operating parameters; calculating values for a set of monitor parameters; displaying values of a sub-set of the MRI operating parameters; displaying the limit values for the sub-set of MRI operating parameters; and displaying the calculated monitor parameter values.

According to another aspect of the invention, a method for providing guidance to a magnetic resonance imaging (MRI) apparatus operator is disclosed. An operating curve is calculated indicating allowable combinations of values for a plurality of MRI operating parameters. An optimized combination of values for the plurality of MRI operating parameters is obtained by analyzing the operating curve.

Preferably, the obtaining of an optimized combination of values for the plurality of MRI operating parameters includes graphically displaying the operating curve on a display area of an associated interactive display device, and receiving a selection of the optimized combination of values from the MRI apparatus operator via the associated interactive display device.

According to yet another aspect of the invention, a magnetic resonance imaging (MRI) apparatus having a user interface (UI) system for interfacing with an associated user is disclosed. A means is provided for exciting a magnetic resonance. A means is provided for detecting the magnetic resonance. A display device and a user input device are provided. A processor cooperates with the user input device to receive values for selectable parameters that define an imaging sequence. The processor calculates minimum and maximum limit values for the selectable parameters, and also calculates values for a plurality of monitor parameter values. The monitor parameter values are determined by the processor based upon the selectable parameter values. A first display area on the display device identifies the values of a sub-set of the selectable parameters and the minimum and maximum limit values therefor. A second display area on the display device identifies the values of the monitor parameters. An interaction means operates in conjunction with the user input device, whereby the associated user selectively supplies a new value for one of the selectable parameters.

Preferably the processor calculates new values for the minimum and maximum limits and new values for the monitor parameters based upon the new value,.

The MRI apparatus preferably further includes a master database memory that contains at least one of a pre-designed sequence parameter values set, a previously run sequence parameter values set, information about previous magnetic resonance imaging sessions, and a historical customer database of sequences. The master database memory further contains sample images corresponding to the sequence parameters sets contained in the memory. A recall area on the display device displays an indication of the sequence parameter values sets stored in the master database memory along with at least one of the sample images.

The MRI apparatus preferably further includes a UI mode selector. The UI mode selector has an operational mode wherein the UI system operatively communicates with the means for exciting a magnetic resonance and with the means for detecting the magnetic resonance. The UI mode selector also has a training mode wherein the UI system does not operatively communicate with the means for exciting a magnetic resonance.

Preferably, the sub-set of the selectable parameters includes at least one of: a repeat time (TR), a resolution, an interecho spacing, a bandwidth, and a time-to-echo (TE). The monitor parameters preferably include at least one of: an estimated signal-to-noise ratio (SNR), a resolution, a scan time, a specific absorption ratio (SAR), a rate of magnetic field change (dB/dt), a $T_1$ weighting, a $T_2$ weighting, and a proton density weighting.

The second display area preferably includes a stacked bar having a first component indicating the estimated signal-to-noise ratio (SNR) and a second component indicating the rate of magnetic field change (dB/dt).

The second display area preferably includes a stacked bar having a first component indicating the $T_1$ weighting, a second component indicating the $T_2$ weighting, and a third component indicating the proton density weighting.

The processor preferably calculates a curve comprising one of a desirability factor function and an operating curve calculated as a function of a domain comprising at least one parameter selected from the selectable parameters. The second display area includes a graphical display of the curve. The interaction means operates in conjunction with the graphical display of the curve whereby the associated user selectively supplies the new value comprising an updated value for the domain.

According to still yet another aspect of the invention, a method is disclosed for providing guidance to a magnetic resonance imaging (MRI) apparatus operator. Limit values are calculated corresponding to selectable parameters. Values are calculated for monitor parameters. Values of a sub-set of the selectable parameters that govern the MRI apparatus operation are displayed. The limit values for the sub-set of the selectable parameters are displayed. The calculated monitor parameter values are displayed.

Preferably, the method further includes optimizing a desirability factor by adjusting at least one selectable parameter in accordance with a pre-defined mathematical optimization algorithm whereby the at least one selectable parameter is optimized.

The displaying of values of a sub-set of the selectable parameters that govern the MRI apparatus operation preferably includes displaying a value of a first selectable parameter on a slider. The displaying of the limit values for the sub-set of independent parameters includes displaying a limit value corresponding to the first selectable parameter on the slider. Preferably, the method also includes receiving a new value for the first selectable parameter by moving the slider, such moving being constrained by the limit value corresponding to the first selectable parameter.

Preferably, the method further includes plotting a curve comprising one of a desirability factor, a monitor parameter, and a selectable parameter, as a function of a domain comprising at least one selectable parameter.

Preferably, the method further includes obtaining a base function value, obtaining at least one penalty function value, normalizing the penalty function value, and calculating a desirability factor function by combining the base function value with the normalized penalty function value.

The calculating of values for monitor parameters preferably further includes normalizing a monitor parameter value with respect to a default value of the monitor parameter.

The method preferably further includes storing information about an imaging session in a data repository. The stored information can include at least one of an independent parameter value, a dependent parameter value, and an image. Selected contents of the data repository are displayed, and a selection of a stored imaging session from the user based on the displayed contents of the data repository is obtained. Initial values for the selectable parameters corresponding to the stored selected imaging session are retrieved from the data repository. Optionally, the data repository is remotely monitored and the stored imaging sessions analyzed to detect MRI apparatus defects or suboptimum imaging conditions selected by the MRI apparatus operator.

One advantage of the present invention is that it provides a graphical user interface for adjusting a sub-set of the independent parameters that are most commonly accessed in clinical MR imaging.

Another advantage of the present invention is that it provides the user with a plurality of monitor parameters in a graphical display format such as a directed arrow, pie chart, bar graph, or the like.

Another advantage of the present invention is that it optimizes a selected set of parameters through iterative optimization of a defined desirability factor that depends upon the selected parameters.

Another advantage of the present invention is that it provides a data repository containing sample images corresponding to stored parameter sets to guide the user in selection of an appropriate stored sequence.

Yet another advantage of the present invention is that it provides a common interface for MRI clinical imaging and for operator training.

Still further advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
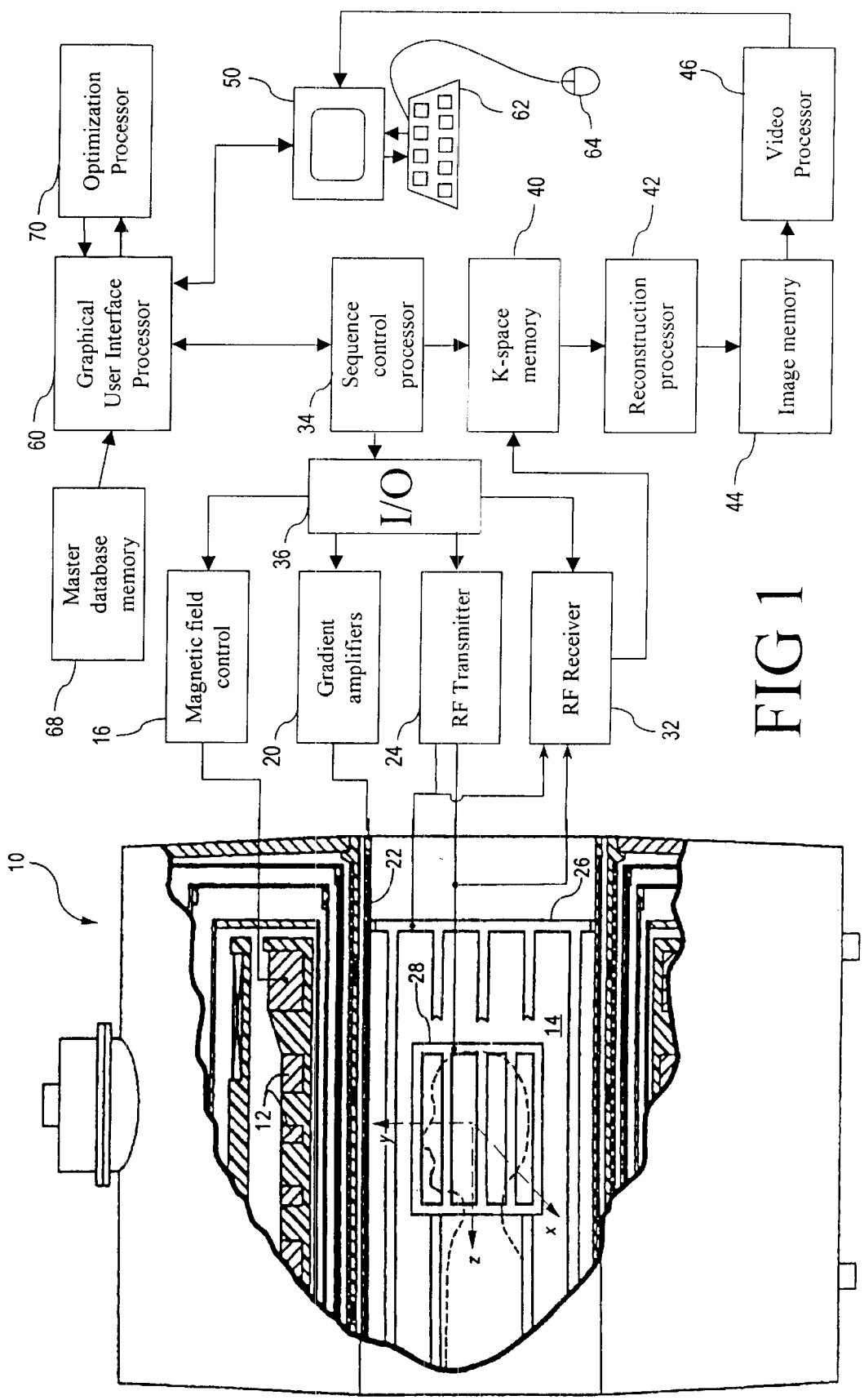
FIG. 1 shows a diagrammatic representation of an MRI apparatus with a graphical user interface in accordance with one aspect of the invention.

With reference to FIG. 1, an MRI scanner 10 includes superconducting or resistive magnets 12 that create a substantially uniform, temporally constant main magnetic field $B_0$ along a z-axis through an examination region 14. Although a bore-type magnet is illustrated in FIG. 1, the present invention is equally applicable to open magnet systems, vertical field systems, and other types of MRI scanners. The magnets 12 are controlled by a main magnetic field control 16. An imaging experiment is conducted by executing a magnetic resonance sequence with the subject being imaged or examined (e.g., patient, phantom, inanimate subject, or the like) placed at least partially within the examination region 14, typically with the region of interest at the isocenter. The magnetic resonance sequence entails a series of RF and magnetic field gradient pulses that are applied to the subject to invert or excite magnetic spins, induce magnetic resonance, refocus magnetic resonance, manipulate magnetic resonance, spatially, spectrally, and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed contiguous to the selected region. For example, as is known in the art, an insertable head coil 28 is inserted surrounding a selected brain region at the isocenter of the bore. Other surface coils or other such specialized RF coils or coil arrays can also be employed. Preferably, the whole-body RF coil 26 induces resonance and the local RF coil receives magnetic resonance signals emanating from the selected region. In other embodiments, the local RF coil excites and receives the resulting magnetic resonance signals.

Regardless of the RF coil configuration, the resultant RF magnetic resonance signals are picked up by one or another of the RF coils employed and demodulated by an RF receiver 32. The MRI apparatus is preferably controlled by a sequence control processor 34 which communicates with the RF and magnetic field components 16, 20, 24, 32 through an input/output (I/O) interface 36 or through other means. The MRI sequence typically includes a complex series of magnetic field gradient pulses and/or sweeps generated by the gradient amplifiers 20, which along with selected RF pulses generated by RF coils 26, 28 result in magnetic resonance echoes that map into k-space. The resulting magnetic resonance signal is sampled using the RF receiver 32 and appropriate receive coils and the acquired sampling data is stored in a k-space memory 40.

The acquired k-space data is processed by a reconstruction processor 42, such as an inverse Fourier transform processor or other reconstruction processor known to the art, to produce a reconstructed image representation that is stored in an image memory 44. The image, or portions thereof, are typically retrieved from the image memory 44, processed by a video processor 46 and displayed on a video terminal 50 or other output device.

Because of the versatility and the resultant complexity of MRI, a critical component of the MRI apparatus is the user interface, which is preferably a graphical user interface 60. The associated operator or user (not shown) interacts with the user interface 60 through an input device such as a keyboard 62 or a mouse 64, and receives feedback from the MRI apparatus via the user interface 60 through a video terminal 50 or the like.

Using the graphical user interface 60, the associated user can select and modify scan sequence parameters such as the scan time, scan resolution, interecho spacing, bandwidth, time-to-echo, and the like. Typically, as many as thirty to fifty parameters are included for defining an imaging scan.

The various parameters are interrelated, insofar as the values of certain parameters effectively constrain the values of certain other parameters. Additionally, parameter limits exist. Some parameter limits are hardware-specific, e.g., the magnets 12 have physical maximum magnetic field strength limitations, the gradient amplifiers have maximum slew rate limitations, and the like. Other parameter limits are imposed by safety considerations, quantified for example by the specific absorption ratio (SAR). Preferably, the user interface processor 60 calculates these limits and conveys the values to the user.

The user interface processor 60 also preferably calculates monitor values which are likely to be useful to the user. These include an estimated signal-to-noise ratio (SNR), the specific absorption ratio (SAR) which is a measure of heat transfer into the patient, the maximum magnetic field gradient dB/dt which is another safety-related parameter, and the like. It will be appreciated that the SAR and the maximum gradient dB/dt are safety parameters which have limit values that are established by governmental regulatory rules.

In addition, a master database memory 68 preferably contains parameter value sets that are pre-designed for certain common MR imaging operations. These are retrieved by the user via the user interface 60 and are executed, in either unmodified form or after selected modifications entered by the user, to obtain images with a minimum of user input. In one preferred embodiment, the memory 68 also includes one or more sample images (not shown) corresponding to the stored sample sequences. The sample images are preferably displayed to the user in association with their corresponding parameter value sets during selection by the user of a sequence from the database memory 68 for a particular imaging task. The sample images provide the user with images of the type typically obtained using the corresponding sequence parameter values, and illustrate the typical contrast, resolution, SNR, et cetera that are obtainable using the sequence parameter values set. The sample images thus serve as an aid to the user in selecting an appropriate sequence.

In a preferred embodiment, the master database memory 68 serves as a data repository 68 that can be used for system monitoring. Selected results from magnetic resonance imaging sessions, such as parameter values, obtained images, and the like, are preferably stored in the master database memory 68. The database can also include a historical customer database of sequences. Such a historical database component can include sequences developed at multiple MRI laboratories that use similar equipment, with periodic collection and updating of the historical data being performed by the equipment manufacturer or other centralized organization.

The master database memory 68 can be used for a number of purposes. It provides a continuously updated collection of imaging configurations with associated sample images for each configuration, which can be accessed by the user through the user interface 60. It can also optionally be accessed by the MRI manufacturer as a means for monitoring the history and performance of the MRI instrument 10 in the field. The historical database component can provide a means for disseminating imaging techniques across multiple MRI laboratories. The database can also advantageously be accessed by field technicians diagnosing equipment problems. The database advantageously provides a record of the scanning parameters used by individual MRI operators and can serve as a tool for evaluating and improving operators' skills.

With continuing reference to FIG. 1, after receiving values for selectable MRI operating parameters from the associated user, either through the entry of individual values or by selection of a scan from the master database memory 68, the user interface processor 60 calculates parameter limits and monitor parameter values therefrom. The results are displayed to the user, preferably in a graphical format, on the display 50.

Preferably, an optimization processor 70 is also provided, for optimizing the values of one or more of the selectable parameters based upon a figure-of-merit or desirability factor function which is to be optimized. For example, the figure-of-merit can be the estimated signal-to-noise ratio (SNR) or a modified version thereof, and the optimized selectable parameters can be the resolution and the scan repeat time. In order to create a desirability factor based upon the estimated SNR, one or more penalty functions are preferably added (or subtracted) from the estimated SNR. The penalty functions preferably generate a penalty in the desirability factor in that the value of the penalty function value becomes increasingly undesirable as the corresponding parameter deviates from a preferred range. The penalty function also preferably normalizes the penalty value, for example based on the unmodified or default parameter value of the memory 68 sequence. Normalization between units can also be included, e.g. conversion of the penalty function into units of SNR before adding (or subtracting).

With reference now to FIG. 2A through FIG. 2E, several preferred embodiments of the user interface display is described. The user interface displays information relating to the scan, preferably on the display 50 that is also selectively used to display the MRI images. Alternatively, another display (not shown) which is different from the display used to show the MRI images is used for the user interfacing display. Regardless of the physical display device used, in a preferred embodiment the display preferably includes at least two display areas, a first display area 100 that shows the selectable parameters (or a sub-set thereof) which can be changed directly by the user, and a second display area 200 that shows the monitor parameters (or a selected sub-set thereof) graphically or in the form of operating curves. Operating curves plot graphical interrelationships and limit boundaries for value combinations of a plurality of parameters. Operating curves are preferably two-dimensional or three-dimensional to enable easy visualization by the user. Thus, each operating curve is preferably based on two or three parameters that are distilled from the larger number of available parameters.

Figure 2A:
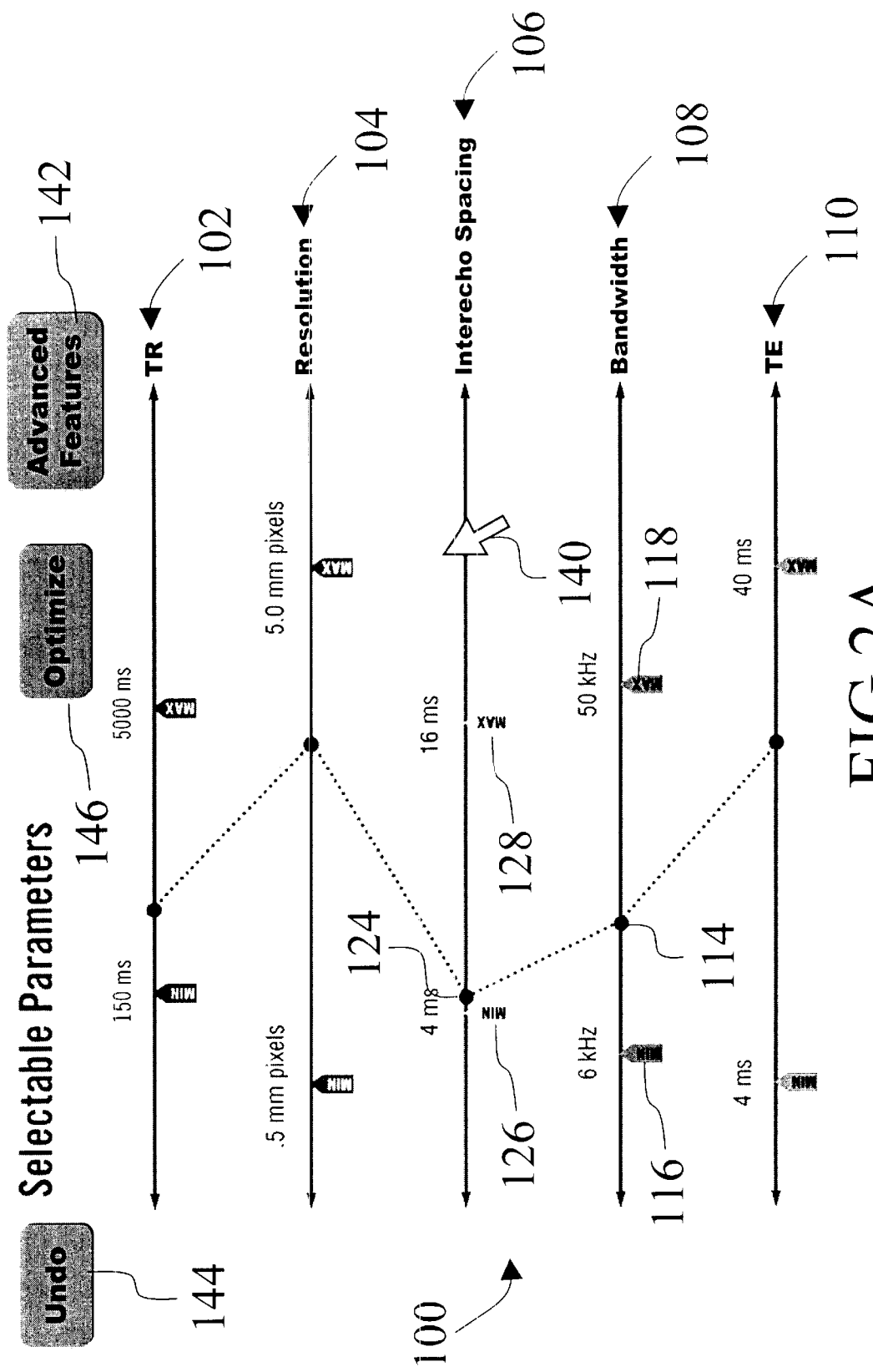
FIG. 2A shows a diagram of a preferred embodiment of the first display area that shows selectable MRI operating parameters in an interactive format.

With particular reference to FIG. 2A, in a preferred embodiment not every selectable parameter that governs the operation of the MRI apparatus is included in a first display area 100. Rather, a selected sub-set containing only the most important parameters is displayed. In the exemplary FIG. 2A, these include a repeat time (TR) 102, a pixel resolution 104, an interecho spacing 106, a bandwidth 108, and a time-to-echo (TE) 110. As will be appreciated by those of ordinary skill in the art, these exemplary parameters correspond to the parameters most commonly modified by technologists who routinely operate clinical MRI systems. Of course, the list of parameters 102, 104, 106, 108, 110 are exemplary, and the displayed parameters can include more, fewer, and/or different parameters. It is contemplated that the displayed sub-set of the selectable parameters can depend upon the nature of the imaging to be performed, e.g. the imaging mode and the body part to be imaged. The display area 100 is substantially simplified over prior art selectable parameter displays which typically include most or all of the parameters that govern the operation of the MRI apparatus (typically twenty to forty parameters) in a text-based format.

As shown in FIG. 2A, the selectable parameters are preferably displayed in a graphical manner which interrelates each parameter value with its minimum and maximum allowable limits. The values are preferably displayed using sliders or the like. For example, the bandwidth 108 is shown in FIG. 2A as having a present value 114 which is approximately intermediate between the minimum limit value 116 and the maximum limit value 118. Thus, the user is aware that significant flexibility exists for the bandwidth parameter 108 and that the present value is well within its range limits.

For comparison, the interecho spacing parameter 106 has a present value 124 that is essentially coincident with its minimum limit value 126 and that is far below its maximum limit value 128. The technologist or other MRI apparatus user is thus made aware, in an intuitive manner, of the approximate value of each of a key sub-set of selectable parameters 102, 104, 106, 108, 110 relative to the corresponding minimum and maximum limits. The first display 100 thus overcomes the cumbersome prior art interfaces.

With continuing reference to FIG. 2A, in addition to displaying the selected sub-set of MRI operating parameters 102, 104, 106, 108, 110, the first display area 100 preferably enables the user to change parameter values. The user preferably uses a pointing device therefor, such as the mouse 64, rather than typing in the new value. In the preferred embodiment, a mouse 64 controls an on-screen pointer 140 by which the user changes a parameter value using a click-and-drag movement or other mechanical action known to the art to slide the value indicated by the slider to a new value. Preferably, the user interface 60 constrains the user from dragging a parameter value beyond a minimum or maximum limit value. Of course, other interaction devices can be employed, such as a trackball (not shown), keyboard 62 manipulation, or the like, by which the associated user supplies a new value for one of the selectable parameters. Other interaction means are also contemplated, such as voice-controlled operation.

It will be appreciated that, although the first display area 100 shows only a sub-set of the most commonly used selectable parameters which are typically accessed by medical technologists and other MRI operators while omitting other less commonly accessed parameters, the full set of parameters which govern the operation of the MRI apparatus are preferably accessible to the user through the user interface 60. These additional parameters are for example preferably assigned values when the user selects a sequence from the master database memory 68. Preferably, the user also can selectively access another display area (not shown) which provides full access to the values of every selectable parameter governing the sequence. This additional display area is preferably similar to the complex display areas of the prior art and need not be shown here for an enabling disclosure. In the preferred embodiment, the additional display area is preferably not ordinarily displayed, but rather is selectively accessed by the user using an advanced or expert selection option such as by operating an "Advanced Features" button 142. It will also be appreciated that the particular sub-set of selectable MRI operating parameters that are shown in the display area 100 preferably depends upon the type of scan being performed, since the relative importance of the various selectable parameters depends in part on the imaging mode.

Figure 2B:
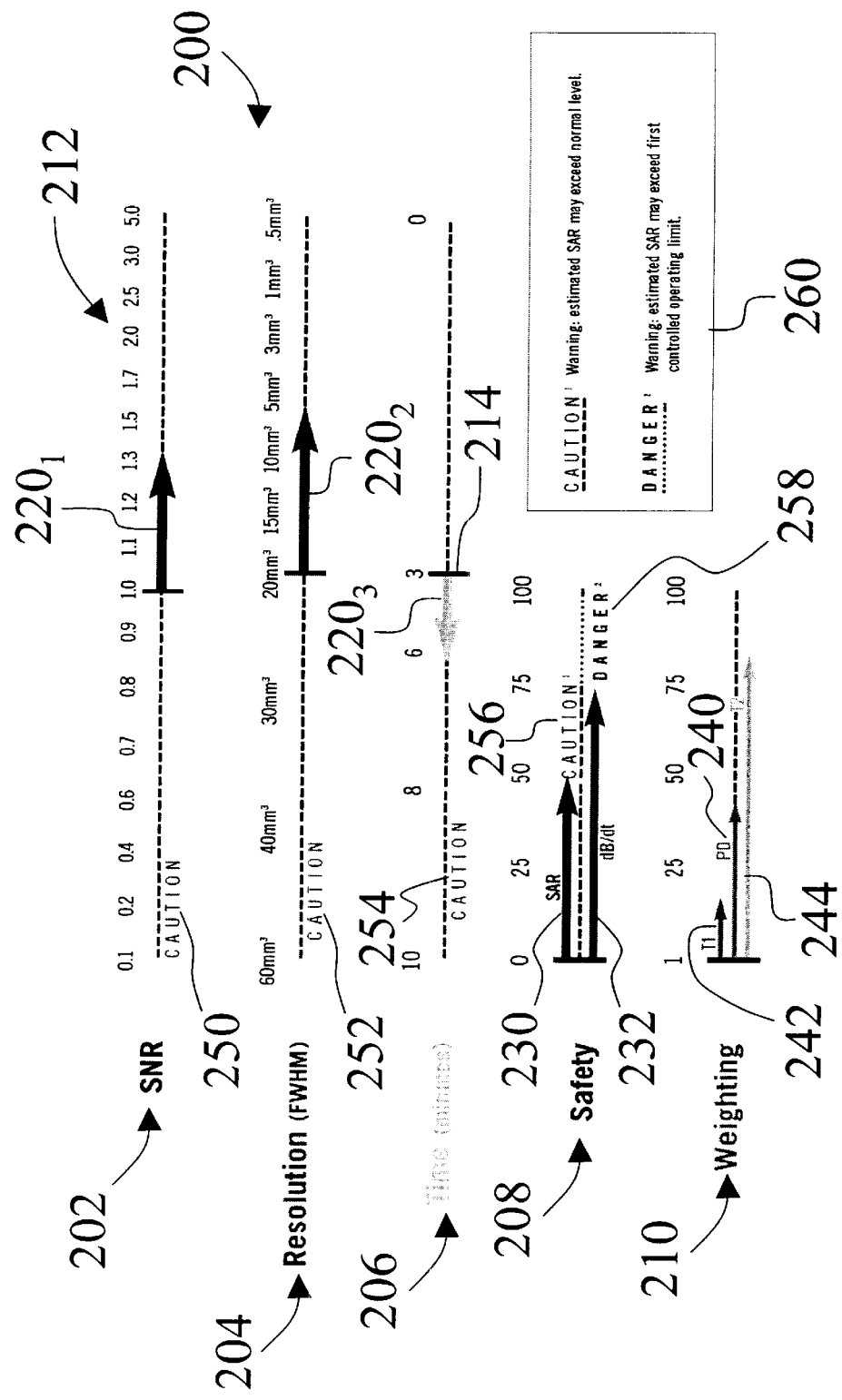
FIG. 2B shows a diagram of a preferred embodiment of the second display area that shows monitor parameters.

With reference now to FIG. 2B, a preferred embodiment of the monitor parameters display 200 is shown. The display 200 preferably displays the monitor parameters graphically. Unlike prior art MRI user interfaces which typically provide the user with very limited information such as only the estimated signal-to-noise ratio (SNR) and perhaps the pixel size, the preferred embodiment provides a relatively large number of useful monitor parameter values to the user. As shown in the preferred embodiment of FIG. 2B, exemplary parameters include an estimated signal-to-noise ratio (SNR) 202, a spatial resolution 204, an imaging time 206, a safety factor 208, and a weighting 210. It is to be appreciated that these monitor parameters 202, 204, 206, 208, 210 are exemplary only. More, fewer, or other monitor parameters can be displayed in the second display area 200. Additionally, the choice of monitor parameters can optionally depend on the imaging mode and conditions.

The monitor parameters displayed in the second display area 200 are calculated by the user interface processor 60 from the selectable parameters. The monitor parameters are preferably not directly modifiable by the user, but rather are changed indirectly in response to new values of the underlying selectable parameters, e.g. through the first display area 100.

The monitor parameters typically have preferred extrema, i.e. the monitor parameters are preferably maximized or minimized for improved image quality and scanning convenience. For example, the estimated SNR 202 is preferably large to provide an image signal with limited noise interference, whereas the imaging time 206 is preferably short to improve patient throughput. A faster scan can also improve image quality by limiting the time during which the patient can move and thereby blur the image. As is well known to those of ordinary skill in the art, tradeoffs are often made between the monitor parameters, e.g. between the estimated SNR 202 and the imaging time 206.

The size of a monitor parameter is often a relative quantity. For example, the estimated SNR 202 has no well-defined absolute lower and upper limits, so that it may not be immediately obvious to the MRI operator whether or not a particular estimated SNR is acceptable. In such cases, a relative scale, e.g. a scale 212 from 0.1 to 5.0, is preferably defined with respect to a nominal estimated SNR that results from the default MRI operating parameter values. In this case the estimated SNR 202 is graphically displayed as a normalized estimated SNR, i.e. normalized to the estimated SNR corresponding to the default parameters. The default parameters can, for example, correspond to the default parameters of the pre-selected sequence that is initially loaded from the memory 68. In the illustrated embodiment of FIG. 2B, a non-linear scale 212 is advantageously employed to reflect a wide range of possible estimated SNR values. Similarly, the imaging time 206 is displayed relative to a default imaging time 214 of 3 minutes.

It will be appreciated that the SNR 202, the spatial resolution 204, and the imaging time 206 are advantageously graphically arranged using a graphical bar or arrow 220$_1$, 220$_2$, 220$_3$ such that the preferred extrema are toward the right. For example, users typically desire a large estimated SNR, i.e. a value greater than the estimated SNR of the default conditions which is represented on the normalized scale 212 as 1.0. Similarly, users prefer a short imaging time 206. The user can thus immediately see from the second display area 200 that a monitor parameter value is in an undesirable area because it has a bar or arrow directed toward the left, e.g. the imaging time bar 220$_3$. In this way, the second display area 200 provides simple and informative graphical feedback to the operator during modification of the selectable MRI operating parameters, e.g. through the display area 100 of FIG. 2A.

With continuing reference to FIG. 2B, in the preferred embodiment the safety factor 208 advantageously includes two component factors: a specific absorption ratio (SAR) 230 and a magnetic field gradient dB/dt 232. These two monitor parameters both relate to patient safety and are thus advantageously plotted together. Such a graphic display advantageously consolidates information on safety to a single region of the display 200.

As is known to those of ordinary skill in the art, the image contrast weighting is typically classified as $T_1$ weighted, $T_2$ weighted, or proton density ($\rho$) weighted, with an actual image typically including these weighting components to varying degrees dependent upon the selectable parameter values and the properties of the imaged subject. For example, an MRI scan performed on a subject using selectable parameter values that produce a strong T2 contrast weighting can nonetheless also include a weaker proton density ($\rho$) weighting component as well. This blending of the relative contrast weighting strengths is advantageously graphically reflected in the preferred embodiment of FIG. 2B by showing the monitor parameters for the proton density ($\rho$) weighting 240, the $T_1$ weighting 242, and the $T_2$ weighting 244 together on a single graphic 210. In this way, the user can easily compare the relative strength of the three weightings 240, 242, 244.

The embodiment of the second display area 200 shown in FIG. 2B includes indicators to warn the user when certain parameter values enter particularly undesirable regions. The user is cautioned 250 when the estimated SNR 202 decreases below 0.4 on the relative scale 212, since imaging conditions corresponding to estimated SNR values below that level typically produce sub-optimal image quality. The user is cautioned 252 when the spatial resolution 204 increases above 40 mm$^3$, as above that value the poor resolution can interfere with interpretation of pertinent anatomical or pathological features. Similarly, the imaging time and SAR values include appropriately labeled caution regions 254, 256.

In the case of the magnetic field gradient dB/dt 232, exceeding a maximum limit presents a particularly significant safety concern. Thus, this undesirable region is labeled "DANGER" 258. Both the SAR 230 and dB/dt 232 safety warnings are advantageously described on-screen in a text box 260.

The warning labels 250, 252, 254, 256, 258 are advantageously visually highlighted, e.g. by displaying these warnings in red print or other distinctive fashion. Additional feedback can be provided to the user through optional audible warnings which sound when particular warning regions are impinged upon. Similarly, the caution or danger label of the impinged warning region can be placed into a blinking or flashing display state to draw the user's attention to the undesirable value.

Figure 2C:
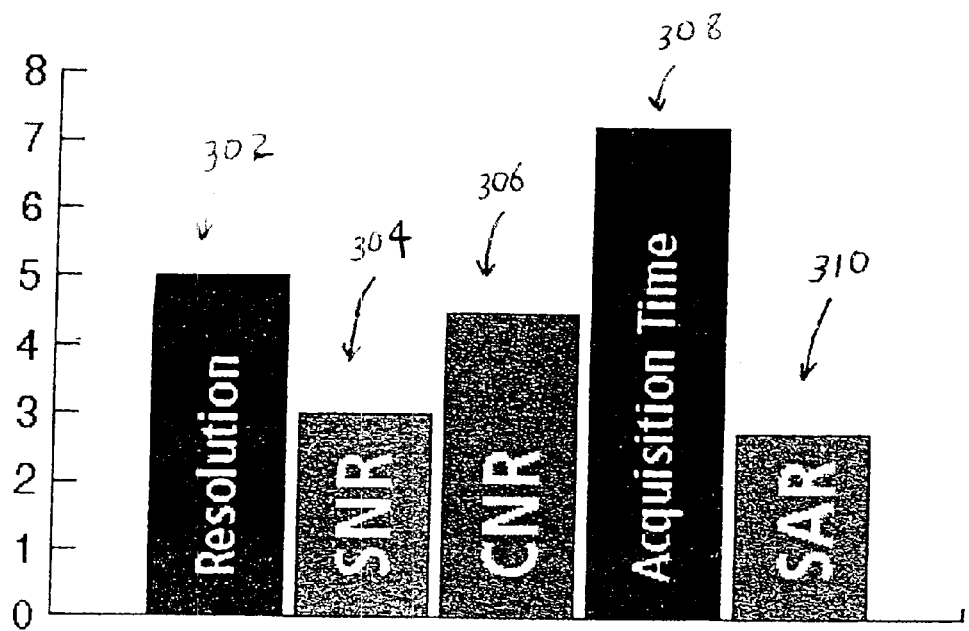
FIG. 2C shows a diagram of another preferred embodiment of the second display area that shows monitor parameters.

With reference now to FIG. 2C, an alternative embodiment of the second display area 300 is shown, in which monitor parameters are shown in a bar graph format. The second display area 300 includes a different set of monitor parameters compared with FIG. 2B. In FIG. 2C, the displayed monitor parameter bars include a resolution bar 302, an estimated signal-to-noise ratio (SNR) bar 304, a contrast-to-noise ratio (CNR) bar 306, an acquisition time bar 308, and a specific absorption ratio bar (SAR) 310. Preferably, the bars 302, 304, 306, 308, 310 are displayed so that the preferred extrema (minimum or maximum) is near the top, i.e. corresponds with a tall bar such as the acquisition time bar 308 of FIG. 2C. In this way, the user can immediately ascertain which parameters are satisfactory and which parameters are in an undesirable range.

Figure 2D:
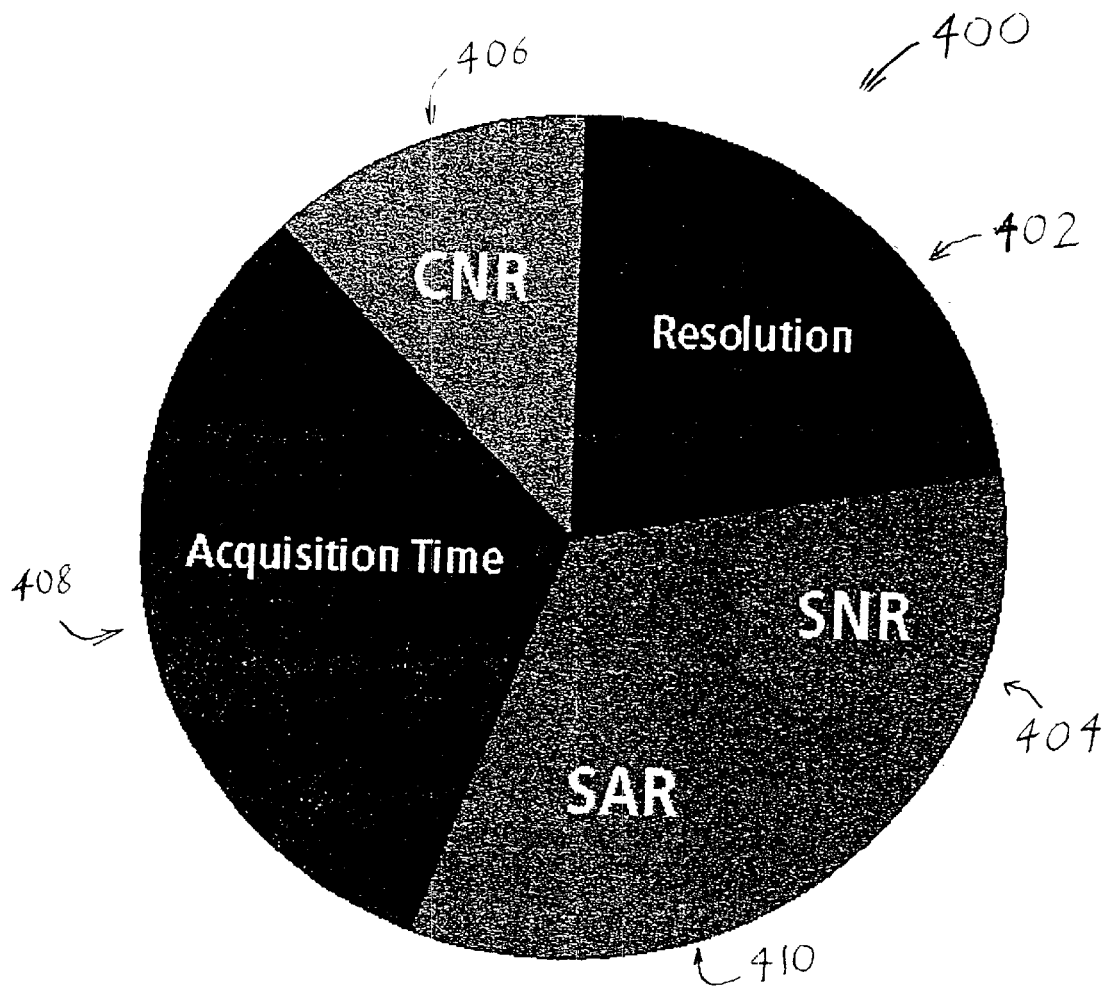
FIG. 2D shows a diagram of yet another preferred embodiment of the second display area that shows monitor parameters.

With reference now to FIG. 2D, yet another preferred embodiment of the second display area 400 is shown, in which monitor parameters are shown as a pie chart. The slices of the pie chart include a resolution slice 402, an estimated signal-to-noise ratio (SNR) slice 404, a contrast-to-noise ratio (CNR) slice 406, an acquisition time slice 408, and a specific absorption ratio slice (SAR) 410. Preferably, the slices 402, 404, 406, 408, 410 are displayed so that a wide slice corresponds with a very satisfactory value whereas a narrow slice corresponds to a less satisfactory value. The pie chart format of the second display area 400 emphasizes the typically relative and interrelated nature of these monitor parameters, as well as the potential for qualitatively trading off, e.g. a longer acquisition time (corresponding to a narrower slice 408) for a higher estimated signal-to-noise ratio (corresponding to a wider SNR slice 404).

Figure 2E:
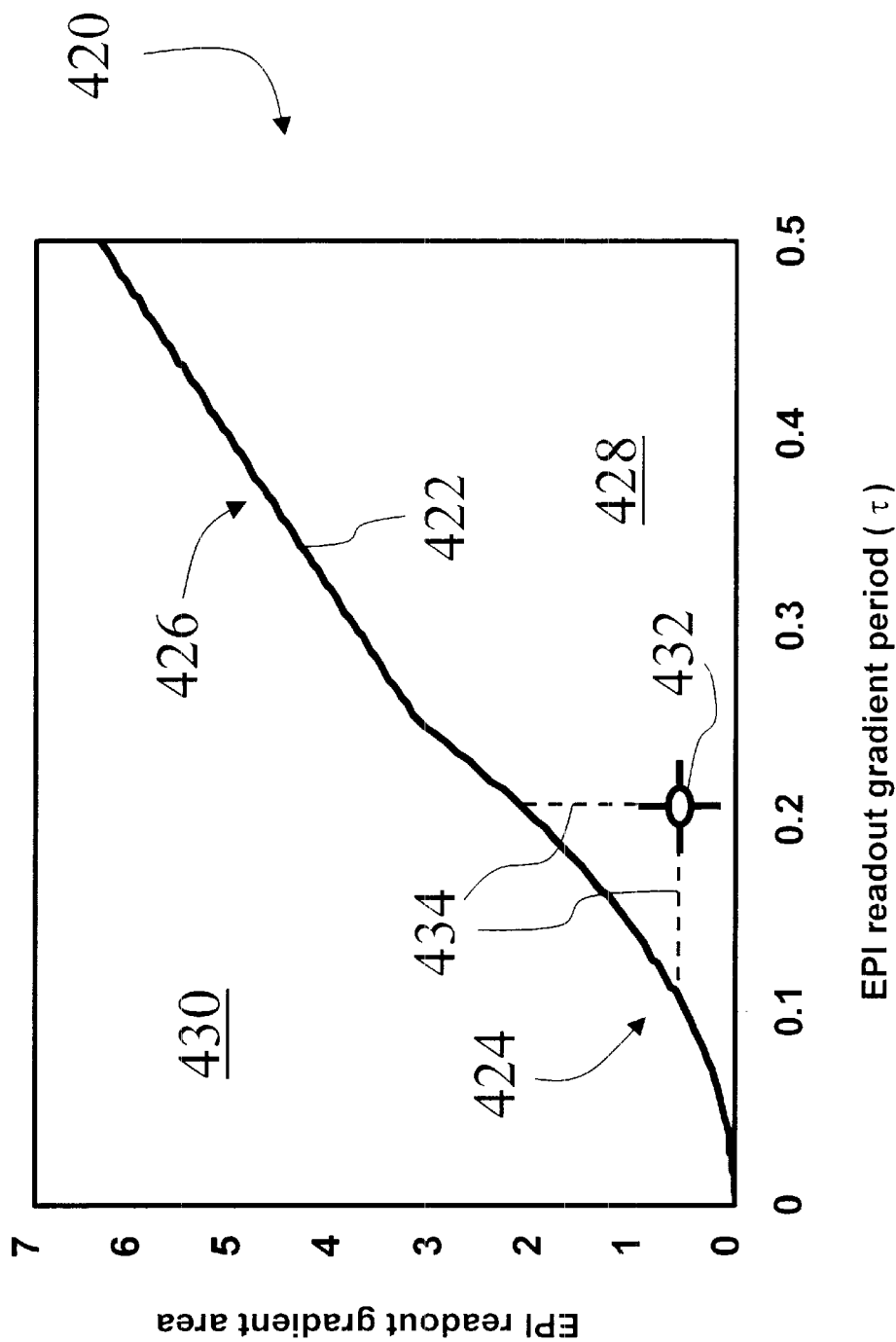
FIG. 2E shows a diagram of still yet another preferred embodiment of the second display area that shows an operating curve.

With reference now to FIG. 2E, yet another preferred embodiment of the second display area 420 is shown. The display area 420 of FIG. 2E shows an operating curve for an EPI sequence. The EPI sequence has an exemplary readout portion that includes a sinusoidal oscillation of the field gradient according to:

$$f(x) = A_p \sin\left(\frac{2\pi x}{\tau}\right) \quad (1)$$

$$\frac{df}{dx} = S_p \cos\left(\frac{2\pi x}{\tau}\right), \quad \text{where } S_p = \frac{2\pi A_p}{\tau}$$

where $\tau$ is the readout sinusoidal cycle period, $A_p$ is the peak gradient amplitude and $S_p$ is the peak rate of change of the gradient, also known as the gradient slew rate. A given MRI apparatus has operational limits for both the gradient amplitude and the gradient slew rate that define maximum values of $A_p$ and $S_p$ for that MRI apparatus. The maximum readout gradient area for a given cycle period $\tau$ is given by:

$$\text{Max Available Area} = \int_{0}^{\frac{1}{2}} f(x)\,dx = \min\left\{\frac{A_p \tau}{\pi}, \frac{S_p \tau^2}{2\pi^2}\right\} \quad (2).$$

The display area 420 shown in FIG. 2E shows an operating curve that plots the maximum readout gradient area 422 as a function of a domain comprising the gradient period τ. The maximum readout gradient area 422 plot includes two regions: a slew-limited parabolic region 424, and an amplitude-limited linear region 426. The maximum gradient area 420 of FIG. 2E is plotted for exemplary values of $A_p$=40 and $S_p$=1000. The region 428 lying below the limit 422 corresponds to the allowed combinations of the gradient area and gradient period τ, while the region 430 lying above the limit 422 corresponds to the physically unattainable combinations of the gradient area and gradient period τ.

The gradient area is related to the resolution, i.e. a larger gradient area corresponds to greater resolution. The readout gradient period τ contributes to the overall scan time. Hence, the operating curve 420 provides the user with a graphical relationship between the maximum achievable gradient area, i.e. resolution, and the EPI gradient period τ which contributes to the scan speed. The display area 420 includes a cursor 432 whereby the user can adjust the gradient period τ and the peak field amplitude of the EPI readout sequence (which corresponds to the gradient area for a given cycle period τ) using the mouse 64 or other pointing means. Preferably, the cursor 432 is restrained from being moved into the forbidden region 430 in which the combination of the selected peak gradient and the selected gradient period τ would cause at least one of the maximum field amplitude $A_p$ and the maximum field slew rate $S_p$ to be exceeded. The graphical display 420 also preferably includes dashed lines 434 that show two suggested directions to move to either minimize the gradient period τ for a fixed gradient area, or to maximize the gradient area for a fixed gradient cycle period τ.

The operating curve 420 relating EPI readout gradient area with EPI readout cycle period τ is exemplary only. Operating curves corresponding to many other relationships between parameter values and parameter limits can be plotted in similar fashion. The selected plots preferably depend upon the type of sequence being set up (e.g., the EPI sequence) and the type of optimization the user is performing (e.g., minimize scan time, maximize resolution or SNR, et cetera). It will be appreciated that preferably only two or three parameters, corresponding to two-dimensional or three-dimensional plots, be related by a particular operating curve. Thus, the user typically will consult one or more such curves in establishing optimized MRI sequence conditions. It will also be recognized that operating curves can be displayed in various areas, e.g. in the first area 100, second area 200, or on another display area such as a full-screen display area that is selectably viewed.

Figure 3:
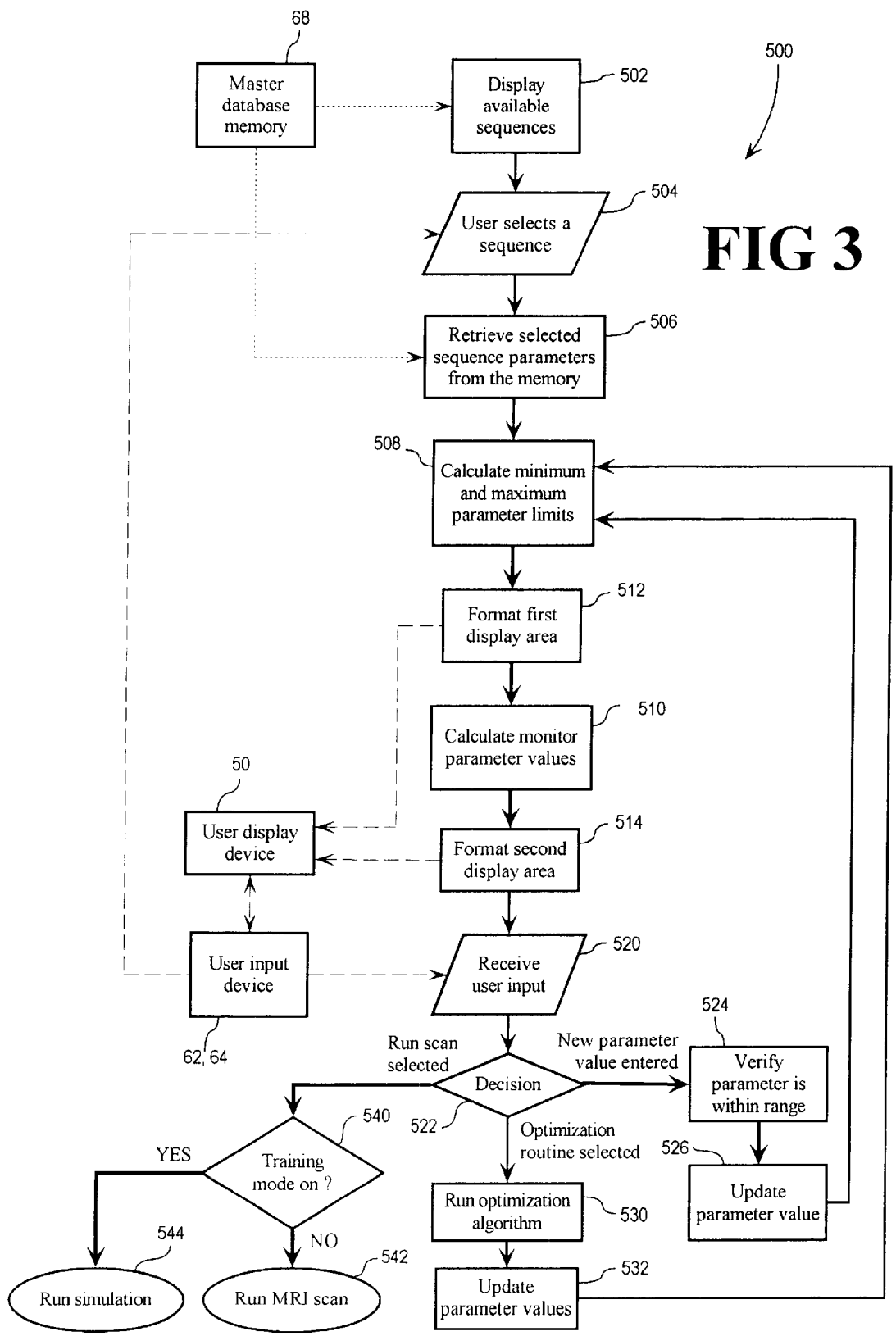
FIG. 3 shows a flowchart of a preferred embodiment of the user interface method.

With reference now to FIG. 3, a preferred embodiment of the user interface method 500 is described. Preferably, the user starts by accessing the available sequences in the master database memory 68. The available sequences are preferably displayed in a step 502. Preferably, the display is an interactive display through which the user can select the desired scan parameter set from the data repository 68 in a step 504, e.g. by a point-and-click operation using the pointing device 64. Optionally, one or more sample images (not shown) corresponding to one or more available scan parameter sets are displayed as well. The sample images advantageously show the user typical imaging results which have been obtained using the associated scan parameter set. The sample images are stored in the memory 68 and can preferably be updated to maintain the master database memory 68 as a machine-specific data repository. In this way the imaging peculiarities of individual machines can be included into the sample images, and optionally updated by users. Similarly, the selections of individual technologists can be monitored for evaluation and training purposes. In another contemplated variation, stored images from different machine types can also advantageously illustrate differences in image properties that are obtained using different MRI machine types, such as open bore versus closed bore machines. Similarly, the effects of different imaging conditions, such as high field versus low field imaging, can be illustrated.

The user selects a sequence in a step 504, whereupon the sequence parameters are retrieved from the database memory 68 in a step 506. Preferably, an entire set of values for the selectable parameters that govern the operation of the MRI apparatus are retrieved, as opposed to retrieving only values for those parameters included in the sub-set of selectable parameters that are displayed in the first display area 100.

In one embodiment, the master database memory 68 includes only a single sequence, i.e. a single default sequence. In this limiting case the displaying and selecting steps 502, 504 can be omitted. However, in view of the very broad range of MRI applications, in the preferred embodiment shown in FIG. 3 the master database memory 68 preferably contains a plurality of sequences, either pre-designed or stored from previous imaging sessions, which apply to a range of imaging tasks. The database memory 68 optionally contains previously executed sequences along with one or more images that have been obtained therewith, as discussed previously.

After retrieving the selectable parameter values in the step 506, the user interface processor 60 calculates minimum and maximum limit values for each selectable parameter in a step 508. The user interface processor 60 also calculates values for the monitor parameters in a step 510. The calculating is preferably again based upon the selectable parameter values.

The graphical user interface 60 formats the first display area in a step 512, which includes the sub-set of selectable parameters and their associated minimum and maximum limit values. The first display area is preferably operatively transmitted to the user display device 50 for displaying to the user. Similarly, the graphical user interface 60 formats the second display area in a step 514, which includes monitor parameters, and this also is preferably operatively transmitted to the user display device 50.

The user interface 60 preferably receives a user input in a step 520. The user input is advantageously via a graphical user interface (GUI) operating in conjunction with the pointing device 64 and an on-screen pointer 140 that preferably can interact with at least the first display area. At a decision step 522, the user interface 60 decides how to respond to the received user input 520 based on the type of input received.

Typically, the first user input after loading a sequence from memory 68 will be the entering of a new selectable parameter value. Upon receipt of a new parameter value, the value is verified to be within the minimum and maximum limits in a step 524. Preferably, the input step 520 operates to simultaneously effectuate the limits verification step 524. This behavior is obtained, for example, using the sliders 102, 104, 106, 108, 110 of FIG. 2A by preventing the user from sliding a parameter value beyond a limit value. For example, the interecho spacing slider 106 is preferably prevented from sliding beyond the maximum value 128 of 16 milliseconds. New values can also optionally be entered via interactive operating curves such as the operating curve 420 of FIG. 2E. In a preferred embodiment, attempting to enter an illegal parameter value or combination of values, e.g. by sliding a parameter beyond a limit value or by moving the cursor 432 of the operating curve into the forbidden region 430, will result in the parameter moving to an extreme limit value and no further. Additionally, the interface 60 preferably provides guidance to the user, such as by an annunciator or warning bell, to indicate that the user attempted to select an unacceptable parameter value or combination of values.

Conditional upon receiving an acceptable value from the user in the steps 520, 524, the system updates the parameter value in a step 526. The user interface 60 loops back and repeats the calculating steps 508, 510 to update any changed parameter limits and monitor parameter values which have been affected by the changed selectable parameter, and reformats the display areas in the steps 512, 514. The looping back accounts for the parameter interdependencies, i.e. changing one parameter value can effectively constrain other parameter values, said changes being reflected in the step 508 as newly calculated parameter limits.

By reviewing the monitor parameters and/or selected operating curves in the second display area 200, 300, 400, 420 after the step 510 recalculates the monitor parameter values to reflect the changed selectable parameter value, the user easily recognizes the effect of the change. In the case where the change produces undesired effects, the user advantageously operates an "undo" option selectable for example by an "Undo Last Change" button 144 (FIG. 2A) in the first display area, by which the user can choose to cancel a change and return to the previous set of selectable parameters. Instead of an undo option, the user can alternatively simply reposition the changed parameter at its previous slider value.

By manually changing a plurality of parameters typically a plurality of times in the aforementioned or a similar manner, a technologist or other MRI operator can improve the value of one or more monitor parameters to obtain manually optimized MRI operating parameter values. However, this process is time consuming, and its success is dependent upon the skill, knowledge, and perseverance of the technologist. In certain situations, the process can be improved upon by defining a desirability function and optionally using an automated mathematical optimization routine. Preferably, the user has the option of selecting such a routine, e.g. by operating an "Optimize" button 146 (FIG. 2A) displayed in the first display area 100, to run an optimization algorithm in a step 530. In a preferred embodiment, when the parameter values are such that an optimization routine can be appropriately run, the optimize button 146 (FIG. 2A) becomes "active" and allows the optimization to drive the parameter values to an optimized solution, e.g. a solution that maximizes a desirability factor.

Figure 4:
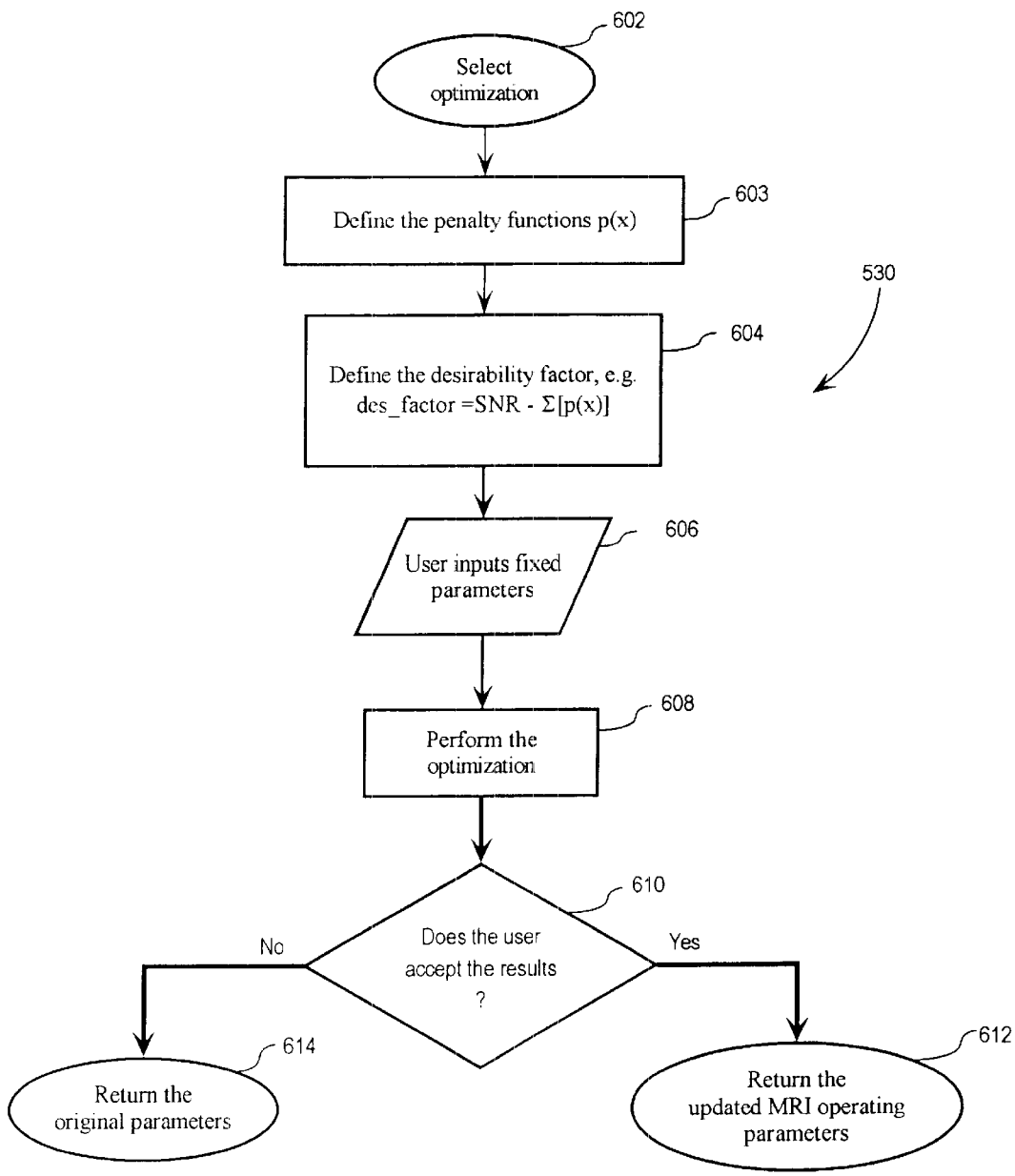
FIG. 4 shows a flowchart of a preferred embodiment of the optimization algorithm.

With continuing reference to FIG. 3, and with further reference now to FIG. 4, the user selects running an optimization routine in the step 520. A choice of optimization routines is made. In a preferred embodiment, a select optimization step 602 is not a user input. Rather, the type of optimization is automatically selected based upon the scan type. The scan type can be determined, for example, based on the type of imaging to be performed (e.g., the organ, body part, or system to be imaged) and the sequence that was initially selected from the memory 68 in the step 504. Typical sequence selections can include SE, FE/CBASS, FSE, EPI (DWI/PWI), GRASE, and other modes and imaging applications. However, other means for selecting the optimization type are also contemplated, including having the user explicitly select the optimization type.

A figure-of-merit or desirability factor function is determined in steps 603, 604. In an exemplary preferred embodiment for one type of optimization, the desirability factor is a modified estimated signal-to-noise ratio (SNR). The estimated SNR is modified by penalty functions that enact gradually or steeply increasing penalties as a selected variable parameter moves outside of selected boundaries. An exemplary parabolic penalty function increases as a parameter x takes on values outside of a range (L,U) according to:

$$P(x) = \begin{cases} 0.5*(x-L)^2, & x < L \\ 0, & L < x < U \\ 0.5*(x-U)^2, & x > U \end{cases} \quad (3).$$

The parabolic penalty function of equation (3) tends to keep the parameter x in the desired range (L,U) because the penalty increases parabolically as x moves outside that range. In some cases the parameter x must be kept within an absolute boundary range, e.g. within the range $(L_2, U_2)$. An example of such a case is a magnetic field gradient hardware limit which physically cannot be exceeded. In such cases the parabolic penalty function of equation (3) can be modified to form a penalty/barrier function, e.g. according to:

$$P(x) = \begin{cases} 1/(x-L_3)^2 - 1/(L_2-L_3)^2 + 0.5*(L_2-L)^2, & x < L_2 \\ 0.5*(x-L^2), & L_2 < x < L \\ 0, & L < x < U \\ 0.5*(x-U)^2, & U_2 < x < U \\ 1/(U_3-x)^2 - 1/(U_3-U_2)^2 + 0.5*(U_2-U)^2, & x > U_2 \end{cases} \quad (4).$$

The bounds L, U, $L_2$, $U_2$, $L_3$, $U_3$ are preferably set at the factory, but optionally are also re-tunable in the field, e.g. by experienced users or maintenance personnel. The penalty functions of equations (3) and (4) are zero within the range (L,U), increases parabolically as x increases above U or decreases below L. In the case of the penalty/barrier function of equation (4), an extremely rapid increase occurs as x exceeds $U_2$ or decreases below $L_2$, thereby effectively creating a mathematical barrier in the optimization process due to the prohibitively undesirable value of the penalty function in the range $x > U_2$ or $x < L_2$.

Another preferred penalty function takes the form of a sigma function, exemplarily expressed below for a parameter x as a C language fsigma( ) function:

```
float fsigma(x, lower, upper, sigma1, sigma2)                                    (5)

float x, lower, upper, sigma1, sigma2;

{ float tmp;

if (x < (lower - 3.*sigma1)) { tmp = 1.;

}else if (x < lower) { tmp = (float)exp(-(double) {

(x - (lower - 3*sigma1))*(x - (lower - 3*sigma1))/(sigma1*sigma1)) );

}else if (x < upper) { tmp = 0.;

}else if (x < (upper + 3.*sigma2)) { tmp = (float)exp(-(double)( (x - (upper + 3*sigma2) )*( x - (upper + 3*sigma2) )/(sigma2*sigma2)));

}else { tmp = 1.;

} return tmp;

}.
```

Figure 5:
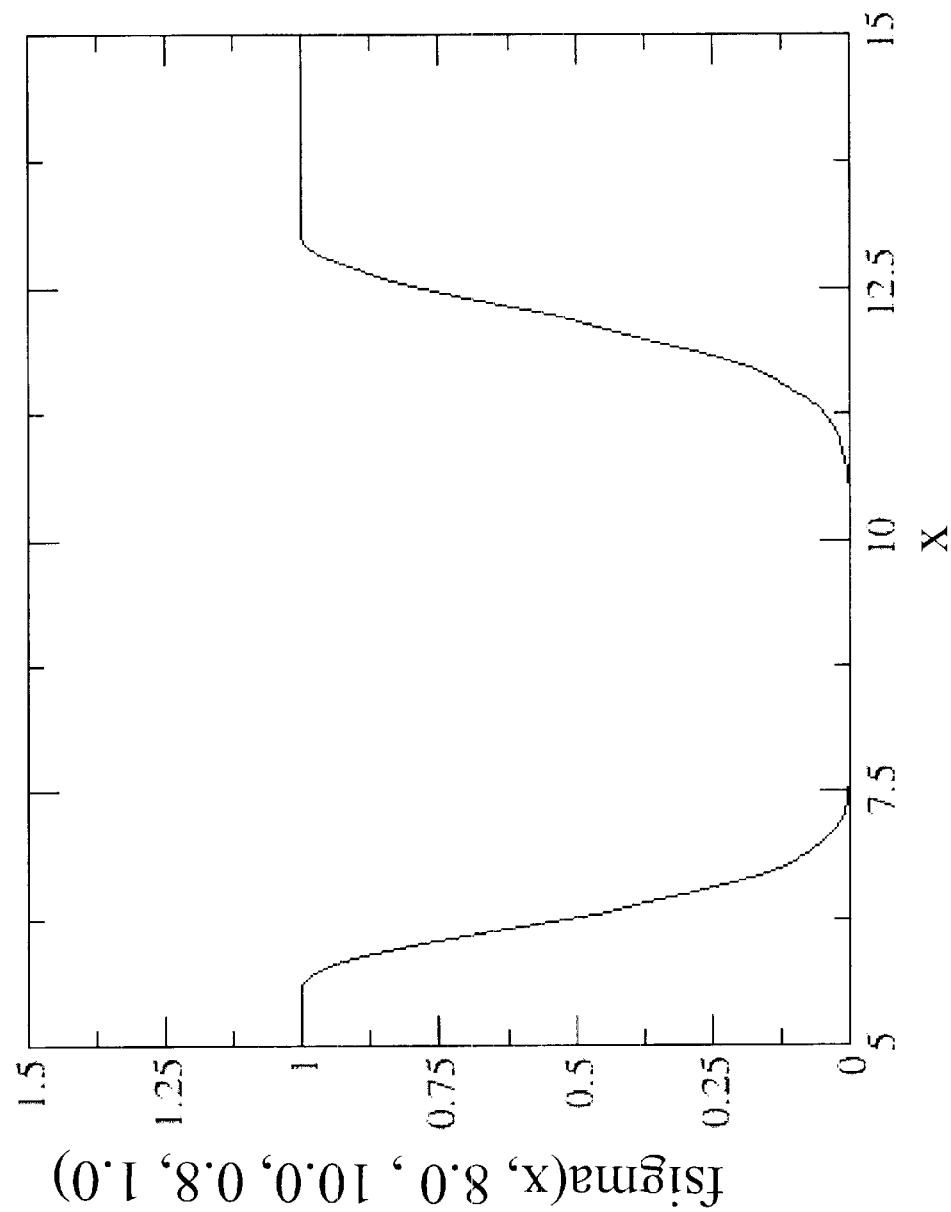
FIG. 5 shows a plot of a preferred embodiment of a penalty function.

A plot of the fsigma( ) function of equation (5) is shown in FIG. 5, where the parameter values are: lower=8.0, upper=10.0, sigma1=0.8, and sigma2=1.0. The penalty function fsigma( ) calculates a penalty based on the value of the parameter x and its relationship with the lower and upper bounds and the sigma function distribution values sigma1 and sigma2.

It will be appreciated that the penalty and penalty/barrier functions of equations (3) through (5) are exemplary only, and various combinations of the functions of equations (3) through (5) as well as many other penalty function forms are also contemplated.

An exemplary figure-of-merit or desirability factor function that is based on the estimated SNR is constructed by subtracting a cost functional from the estimated SNR in a step 604. The cost functional is a linear combination of one or more penalty functions, e.g. a linear combination of penalty functions of the form given in equations (3) through (5). Hence, once the penalty functions are defined in a step 603, the penalty functions are subtracted from the estimated SNR to form the exemplary SNR-modified desirability factor function in the step 604. It will be recognized that the modified SNR is preferably maximized; thus, a subtracting of the penalty functions properly introduce a penalty in the estimated SNR-based desirability factor function for a parameter value x that lies outside the region defined by the upper and lower bounds. Using the exemplary fsigma( ) penalty function of equation (5), an exemplary desirability factor (des_factor) is written in the C programming language as:

$$\text{des\_factor} = \text{usersnr} \tag{6}$$

$$- a1*\text{fsigma}(*\text{est\_scan\_time}, 1500., 1800., 200., 200.)$$

-continued
$$- a2*\text{fsigma}(\text{echo\_time}, 5000., 10000., 500., 500.)$$

$$- a3*\text{fsigma}(\text{is\_pphase\_matrix}, 0.75*\text{is\_read\_matrix},$$

is_read_matrix, is_read_matrix/10., 1.)

$$- a4*\text{fsigma}(\text{cnrval}, 0.04, 1., 0.1, 0.01);$$

where each fsigma( ) function applies a sigma penalty function corresponding to a parameter value, the exemplary parameters including an estimated scan time (*est_scan_time), an echo time (echo_time), et cetera. The prefactors a1, a2, a3, a4 determine how strongly each parameter affects the desirability factor. In a typical exemplary desirability factor function, values for these prefactors are a1=9000, a2=6000, a3=7500, a4=6000. Physically, the prefactors can also be viewed as converting the penalty function into proper SNR units. The parameter values a1, a2, a3, a4 are advantageously selected to provide the desired parameter weightings for the imaging optimization being performed.

It is again emphasized that, since the estimated SNR that forms the basis for the desirability factor function of equation (6) is preferably maximized, the penalty functions are subtracted from the SNR to form the desirability factor (des_factor), thereby properly incorporating the penalty factors as penalties that reduce the value which is to be maximized. On the other hand, if the basis function is one which is preferably minimized, e.g. a scan time-based desirability function, then the penalty functions are advantageously added to the scan time to form the desirability factor. Preferably, the direction of the optimization (toward minimization or toward maximization of the desirability factor) is determined without user intervention based upon the selected basis function. For example, the exemplary modified SNR is preferably maximized. On the other hand, a scan time-based desirability function would preferably be minimized, as a short scan time is preferred over a longer scan time. It will be appreciated that the desirability function of equation (6) is exemplary, and that many other forms and implementations of the desirability factor function are also contemplated.

The user identifies and supplies values for the fixed parameters in a step 606. The fixed parameters typically include the field of view (FOV), the phase FOV, slice thickness, number of slices, the read matrix, the flip angle, and the signal averages. Of course, more, fewer, or different fixed parameters can be used. In a preferred embodiment, these values are the values obtained from the memory sequence and possibly modified by the user, e.g. in the step 526. The identification of the fixed parameters can be hard-coded into the optimization routine, or the user can selectively identify which parameters to keep fixed. It will be appreciated that those parameters which contribute to the desirability factor through expressed penalty functions, e.g. estimated scan time (*est_scan_time), echo time (echo_time), et cetera in equation (6), are preferably variable parameters in the optimization. Additionally, other parameters that contribute to the desirability factor indirectly through the estimated SNR basis function, e.g. flip_angle, repeat_time, et cetera, can also optionally be included as variable parameters in the optimization.

The mathematical optimization algorithm is performed in a step 608. In a preferred embodiment, an iterative least squares optimization algorithm is used, where the fitted parameters are the parameter values to be optimized. In one embodiment in which the MRI apparatus 10 has only four allowable choices for the bandwidth, namely 15.62 kHz/pixel, 20.83 kHz/pixel, 25 kHz/pixel, 31.25 kHz/pixel, the above optimization is preferably repeated four times, each time using one of the four bandwidths as a fixed parameter. The selected solution is that optimized solution that has the largest desirability factor, and the corresponding bandwidth is thus simultaneously selected. Other parameters that can assume only a relatively small number of discrete values can advantageously be handled in such a search grid fashion.

It will be recognized by those of ordinary skill in the art that many mathematical optimization methods and techniques can be employed for the iterative mathematical optimization, for example a modified Newton method, a least squares fitting algorithm, a non-linear constrained optimization, et cetera. Additionally, in the case of a desirability function such as a modified scan time that is preferably minimized, the optimization method of course preferably minimizes the desirability factor function.

Upon convergence of the optimization routine, the updated fitted selectable parameters are preferably displayed to the user for acceptance in a step 610. Preferably, the parameter limits and the monitor parameter values are also re-calculated using the optimized parameter values, e.g. according to steps 508, 510 of FIG. 3. After reviewing the optimized operating curves resulting from the re-calculating step 510, the user preferably has the option of accepting the optimization results or rejecting these results. If the user accepts the results, the updated fitted values of the selectable parameters are returned in a step 612 and the parameter update is made in a step 532 of FIG. 3. If the user rejects the results, the original values of the selectable parameters are returned in a step 614.

To summarize, the user selects suitable parameter values by loading a sequence from the master database memory 68 (e.g., a pre-designed sequence) according to steps 504 and 506, by individually setting parameter values such as through the selectable parameters display 100 of FIG. 2A according to steps 524 and 526, by using the optimization routine according to step 530 and 532, or by any combination of these methods. The user receives real-time feedback on the effects of the parameter changes through the monitor parameters and the operating curves provided in the exemplary display 200, 300, 400, 420 shown in FIGS. 2B to 2E, respectively. Once the user is satisfied with the selected parameter values, the user typically selects to run the scan, using an appropriate selection input means (not shown) of the user interface 60.

The optimization routine described above with particular reference to FIG. 4 is essentially automated. In another aspect of the invention, however, a semi-automated optimization provides greater flexibility in parameter selection, as described next.

Figure 6:
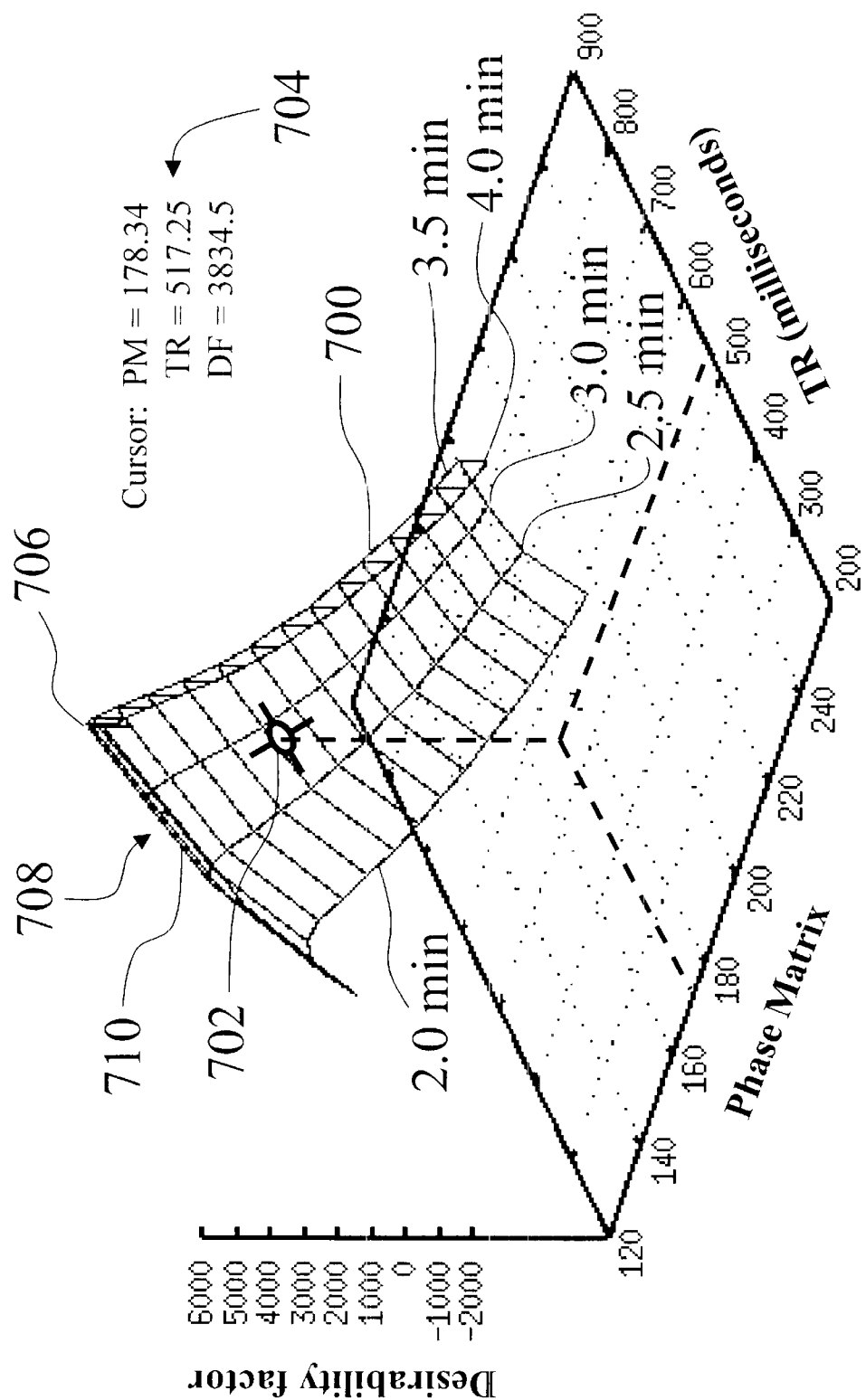
FIG. 6 shows a graph of an exemplary desirability surface for use in semi-automated optimization.

With reference now to FIG. 6, the desirability factor function, e.g. the exemplary des_factor function of equation (6), is calculated for a matrix of values of the selectable parameters. In the exemplary FIG. 6, the desirability factor function is calculated and plotted for a grid of domain values comprising a plurality of phase matrix values and a plurality of echo time TR values. In performing the calculation, the estimated scan time is taken as a parameter having values of 2.0 min, 2.5 min, 3.0 min, 3.5 min, and 4.0 min, in order to construct a wire mesh 700 of the desirability function surface as shown in FIG. 6. The desirability function is represented by the wire mesh surface representation 700 in a three-dimensional surface plot. In a preferred embodiment, the user is supplied with an interactive cursor 702 which enables the user to move along the surface 700. Such movement corresponds to selecting different domain values comprising values for the phase matrix and the echo time TR. The cursor values of the phase matrix, TR, and the desirability factor are preferably displayed numerically 704. By moving across the surface 700, the user can select an optimized value for the corresponding phase matrix and TR parameters based on the calculated desirability factor plot, i.e. a semi-automatic optimization is performed.

An advantage of the semi-automatic method just described with reference to FIG. 6 is that the user can recognize and take advantage of shallow extrema of the desirability factor. Considering the exemplary surface 700, the fully automated optimization routine would identify and select the maximum desirability factor value 706. However, it will be noticed that this maximum corresponds to a rather large value for the echo time TR, and a correspondingly long scan time of about 3.5 min. It will also be recognized from the graphical representation of the surface 700 that a fairly large range of values 708 exist for which the desirability factor decreases only slightly from its maximum value 706. Thus, the user can optionally select another value such as the value 710 that provides a similarly large, albeit not fully maximized, desirability factor with a much lower echo time TR and a correspondingly shorter scan time of about 2.7 min.

The graphical desirability factor representation of FIG. 6 is exemplary only. It will be recognized by those skilled in the art that similar graphical constructs can be generated for interrelating a wide range of other parameters for various optimization problems. The selection of domain parameters will preferably depend upon the MRI scan type and the desired imaging properties. In order to enable a surface plot, the number of selectable parameters in the domain should be kept to one (linear plot) or two (surface plot).

Another embodiment of the desirability factor that is appropriate for use with certain types of fast spin echo (FSE) imaging is given as a code portion written in the C programming language as:

$$\text{des\_factor} = \text{usersnr} \qquad (7)$$

$- (*\text{pen\_con1}) * \text{fsigma}((\text{float}) * \text{est\_scan\_time}, *\text{pen\_low1},$
  $*\text{pen\_upr1}, *\text{pen\_std1}, *\text{pen\_std1})$ $- (*\text{pen\_con2}) * \text{fsigma}(\text{pseudo\_echo\_time}, *\text{pen\_low2},$
  $*\text{pen\_upr2}, *\text{pen\_std2}, *\text{pen\_std2})$ $- (*\text{pen\_con3}) * \text{fsigma}(\text{inter\_echo\_time},$
  $*\text{pen\_low3}, *\text{pen\_upr3}, *\text{pen\_std3}, *\text{pen\_std3});.$ In equation (7), the target resolution is not subject to a penalty function. However, the estimated scan time, the echo time, and the inter-echo spacing are subject to penalty functions of the fsigma( ) form.

The desirability function des_factor of equation (8) depends upon parameters, e.g. pen_con1, pen_upr1, and the like. By selecting appropriate parameter values, the desirability function can be employed in a variety of FSE imaging situations. For myelonographic FSE, the following parameters are appropriate (note that application specifies resolution first (256×512), PSR=1.625, number of slices=21, and TR=4733 msec):

Myelo: 16ETL FSE  (8)

time pen_con1: 9000. : *float* pen_upr1: 2400. : *float* pen_low1: 1200. : *float* pen_std1: 200. : *float* pseudo echo pen_con2: 6000. : *float* pen_upr2: 250000. : *float* pen_low2: 200000. : *float* pen_std2: 500. : *float* interecho spacing pen_con3: 7500 : *float* pen_upr3: 15000 : *float* pen_low3: 13000 : *float* pen_std3: 1000 : *float.*

For imaging the head region, the following parameters are appropriate (note that applications specifies resolution first (256×384), PSR=0.75, number of slices=24, and TR=5216 msec):

Head 16ETL FSE  (9)

time pen_con1: 9000. : float pen_upr1: 2400. : float pen_low1: 1800. : float pen_std1: 200. : float pseudo echo pen_con2: 6000. : float pen_upr2: 115000. : float pen_low2: 95000. : float pen_std2: 500. : float.

The desirability factor of equation (7) is thus applicable to a variety of FSE imaging situations, e.g. myelographic imaging and imaging of the head region, simply by changing parameter values, e.g. according to equation (8) and equation (9), respectively. In one embodiment, the parameters are accessible through a parameters page (not shown) of the user interface processor 60.

Preferably, the graphical user interface 60 includes a training mode. In this case, upon selection of running the scan the user interface 60 first checks whether the training mode is on in a decision step 540. If the training mode is not active, then the user interface 60 directs the MRI apparatus to run the scan according to the selected parameters in a step 542, e.g. according to the exemplary MRI apparatus embodiment already described with particular reference to FIG. 1.

If, however, at the decision step 540 the user interface 60 determines that the training mode is active, then the user interface advantageously runs a scan simulation in a step 544. The scan simulation preferably uses any appropriate MRI training simulation software, using the selected parameter values as inputs thereto. Thus, the user advantageously receives training with the same graphical user interface 60 that is also used for actual clinical MRI imaging. Additionally, by comparing simulated images with the corresponding qualitative parameters, e.g. SNR, resolution, et cetera, displayed on the operating curve display 200 (or 300 or 400), the user beneficially learns to correlate the monitor parameter values with features typically observed in MRI images obtained therewith.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method for providing guidance to a magnetic resonance imaging (MRI) apparatus operator, the method comprising:
   receiving initial values for a plurality of MRI operating parameters;
   calculating limit values corresponding to the MRI operating parameters;
   calculating values for a set of monitor parameters;
   calculating a desirability factor function which depends upon the plurality of MRI operating parameters;
   obtaining optimized values for the plurality of MRI operating parameters through analysis of the desirability factor function;
   displaying values of a sub-set of the MRI operating parameters;
   displaying the limit values for the sub-set of MRI operating parameters; and
   displaying at least two of the calculated monitor parameter values as a multi-component display that displays at least one of:
      a first component indicating the estimated signal-to-noise ratio (SNR) and a second component indicating the rate of magnetic field change (dB/dt), and
      a first component indicating the $T_1$ weighting, a second component indicating the $T_2$ weighting, and a third component indicating the proton density weighting.

2. The method as set forth in claim 1, wherein the calculating of a desirability factor function includes:
   calculating a monitor function;
   calculating a penalty function corresponding to a first parameter selected from the plurality of MRI operating parameters; and
   calculating the desirability factor function by mathematically combining the monitor function and the penalty function.

3. The method as set forth in claim 2, wherein:
   the calculating of a monitor function includes calculating an estimated signal-to-noise ratio value; and
   the mathematical combining includes additively or subtractively combining the estimated signal-to-noise ratio with the penalty function.

4. The method as set forth in claim 2, wherein:
   the calculating of the penalty function includes calculating a barrier function that has a prohibitively undesirable value within a pre-selected range of the first parameter.

5. The method as set forth in claim 2, wherein the calculating of the penalty function includes:
   calculating a function whose value becomes less desirable as the value of the first parameter increasingly deviates from a default range.

6. The method as set forth in claim 1, wherein the obtaining of optimized values for the plurality of MRI operating parameters through analysis of the desirability factor function includes:
   optimizing the desirability factor function with respect to at least one of the plurality of MRI operating parameters using an iterative optimization algorithm.

7. The method as set forth in claim 1, wherein the obtaining of optimized values for the plurality of MRI operating parameters through analysis of the desirability factor function includes:
   graphically displaying a plot of the desirability factor function plotted against at least one of the plurality of MRI operating parameters on a display area of an associated interactive display device; and
   receiving a selection of the optimized values from the MRI apparatus operator via the associated interactive display device.

8. The method as set forth in claim 1, wherein the multi-component display includes
   a stacked bar.

9. A magnetic resonance imaging (MRI) apparatus having a user interface (UI) system for interfacing with an associated user, the MRI apparatus comprising:
   a means for exciting a magnetic resonance;
   a means for detecting the magnetic resonance;
   a display device;
   a user input device;
   a processor that cooperates with the user input device to receive values for selectable parameters that define an imaging sequence and calculates minimum and maximum limit values for the selectable parameters and that also calculates values for a plurality of monitor parameter values, said monitor parameter values being determined by the processor based upon the selectable parameter values;
   a first display area on the display device for displaying a slider identifying the values of a sub-set of the selectable parameters and the minimum and maximum limit values therefor, the sub-set of selectable parameters including at least one of a $T_1$ weighting, a $T_2$ weighting, and a proton density weighting;
   a second display area on the display device for identifying the values of the monitor parameters; and
   an interaction means operating in conjunction with the user input device, whereby the associated user selectively supplies a new value by moving the slider for one of the selectable parameters, movement of the slider being constrained by the minimum and maximum limit values corresponding to the selectable parameter.

10. A magnetic resonance imaging (MRI) apparatus having a user interface (UI) system for interfacing with an associated user, the MRI apparatus comprising:
   a means for exciting a magnetic resonance;
   a means for detecting the magnetic resonance;
   a display device;
   a user input device;
   a processor that cooperates with the user input device to receive values for selectable parameters that define an imaging sequence and calculates minimum and maximum limit values for the selectable parameters;
   a display area on the display device for identifying the values of a sub-set of the selectable parameters and the minimum and maximum limit values therefor;
   an interaction means operating in conjunction with the user input device, such that the associated user selectively supplies a new value for one of the selectable parameters;
   a master database memory containing at least one of a pre-designed sequence parameter values set, a previously run sequence parameter values set, information about previous magnetic resonance imaging sessions, and a historical customer database of sequences, and that further contains sample images corresponding to the sequence parameters sets contained in the memory; and a recall area on the display device for displaying an indication of the sequence parameter values sets stored in the master database memory along with at least one of the sample images.

11. A magnetic resonance imaging (MRI) apparatus having a user interface (UI) system for interfacing with an associated user, the MRI apparatus comprising:

a means for exciting a magnetic resonance;

a means for detecting the magnetic resonance;

a display device;

a user input device;

a processor that cooperates with the user input device to receive values for selectable parameters that define an imaging sequence and calculates minimum and maximum limit values for the selectable parameters, and that also calculates values for a plurality of monitor parameter values, said monitor parameter values being determined by the processor based upon the selectable parameter values;

a first display area on the display device for identifying the values of a sub-set of the selectable parameters and the minimum and maximum limit values therefor;

a second display area on the display device for identifying the values of the monitor parameters;

an interaction means operating in conjunction with the user input device, such that the associated user selectively supplies a new value for one of the selectable parameters; and a UI mode selector, said UI mode selector having:
an operational mode wherein the UI system operatively communicates with the means for exciting a magnetic resonance and with the means for detecting the magnetic resonance; and
a training mode wherein the UI system does not operatively communicate with the means for exciting a magnetic resonance.

12. A method for providing guidance to a magnetic resonance imaging (MRI) apparatus operator, the method comprising:

calculating limit values corresponding to selectable parameters;

calculating values for monitor parameters;

displaying values of a sub-set of the selectable parameters that govern the MRI apparatus operation including displaying a value of a first selectable parameter on a slider;

displaying the limit values for the sub-set of the selectable parameters including displaying a limit value corresponding to the first selectable parameter on the slider;

displaying the calculated monitor parameter values; and receiving a new value for the first selectable parameter by moving the slider, said moving being constrained by the limit value corresponding to the first selectable parameter.

13. The method as set forth in claim 12, further comprising:

optimizing a desirability factor by adjusting at least one selectable parameter in accordance with a pre-defined mathematical optimization algorithm whereby the at least one selectable parameter is optimized.

14. The method as set forth in claim 12, further comprising:

obtaining a base function value;

obtaining at least one penalty function value;

normalizing the penalty function value; and calculating a desirability factor function by combining the base function value with the normalized penalty function value.

15. The method as set forth in claim 12, wherein the calculating of values for monitor parameters further comprises:

normalizing a monitor parameter value with respect to a default value of the monitor parameter.

16. The method as set forth in claim 12, further comprising:

storing information about an imaging session in a data repository, said information including at least one of an independent parameter value, a dependent parameter value, and an image;

displaying selected contents of the data repository;

obtaining a selection of a stored imaging session from the user based on the displayed contents of the data repository; and retrieving initial values for the selectable parameters corresponding to the stored selected imaging session from the data repository.

17. A method for providing guidance to a magnetic resonance imaging (MRI) apparatus operator, the method comprising:

calculating limit values corresponding to selectable parameters;

calculating values for monitor parameters;

displaying values of a sub-set of the selectable parameters that govern the MRI apparatus operation;

displaying the limit values for the sub-set of the selectable parameters;

displaying the calculated monitor parameter values; and plotting a curve comprising one of a desirability factor, a monitor parameter, and a selectable parameter, as a function of a domain comprising at least one selectable parameter.

18. A method for providing guidance to a magnetic resonance imaging (MRI) apparatus operator, the method comprising:

storing information about an imaging session in a data repository, said information including at least one of an independent parameter value, a dependent parameter value, and an image;

displaying selected contents of the data repository;

obtaining a selection of a stored imaging session from the user based on the displayed contents of the data repository;

retrieving initial values for selectable parameters corresponding to the stored selected imaging session from the data repository; and remotely monitoring the data repository and analyzing the stored imaging sessions to detect MRI apparatus defects or sub-optimum imaging conditions selected by the MRI apparatus operator.

19. An apparatus for providing guidance to a magnetic resonance imaging (MRI) apparatus operator, the apparatus comprising:

a means for calculating limit values corresponding to selectable parameters that govern the MRI apparatus operation;

a means for calculating values for monitor parameters;

a display means for displaying values of a sub-set of the selectable parameters and calculated limit values therefor and for displaying the calculated monitor parameter values; and a means for plotting a curve comprising one of a desirability factor, a monitor parameter, and a selectable parameter, as a function of a domain comprising at least one selectable parameter.

* * * * *